United States Patent
Henson (10) Patent No.: US 9,761,676 B2
(45) Date of Patent: Sep. 12, 2017

(54) POWER SEMICONDUCTOR DEVICE WITH EMBEDDED FIELD ELECTRODES

(71) Applicant: Infineon Technologies Americas Corp., El Segundo, CA (US)

(72) Inventor: Timothy D. Henson, Mount Shasta, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/634,614

(22) Filed: Feb. 27, 2015

(65) Prior Publication Data
US 2015/0279946 A1 Oct. 1, 2015

Related U.S. Application Data

(60) Provisional application No. 61/970,729, filed on Mar. 26, 2014.

(51) Int. Cl.
*H01L 29/40* (2006.01)
*H01L 21/321* (2006.01)
*H01L 29/78* (2006.01)
*H01L 29/66* (2006.01)

(52) U.S. Cl.
CPC .......... *H01L 29/407* (2013.01); *H01L 29/404* (2013.01); *H01L 29/66734* (2013.01); *H01L 29/7813* (2013.01)

(58) Field of Classification Search
CPC ........... H01L 29/66734; H01L 29/1095; H01L 29/407; H01L 29/7813; H01L 29/404; H01L 1121/3212

USPC .......................................... 257/339; 438/270
See application file for complete search history.

(56) References Cited

U.S. PATENT DOCUMENTS

| | | | |
|---|---|---|---|
| 2002/0102786 A1 | 8/2002 | Madson | |
| 2003/0214009 A1* | 11/2003 | Parthasarathy | H01L 29/0634 257/492 |
| 2005/0082591 A1* | 4/2005 | Hirler | H01L 29/0619 257/302 |
| 2006/0214221 A1 | 9/2006 | Challa | |
| 2012/0025304 A1* | 2/2012 | Blank | H01L 29/407 257/331 |
| 2013/0082322 A1 | 4/2013 | Weber | |
| 2013/0134505 A1* | 5/2013 | Kobayashi | H01L 29/66348 257/330 |
| 2014/0374842 A1* | 12/2014 | Weber | H01L 29/404 257/409 |

* cited by examiner

*Primary Examiner* — Cuong Q Nguyen
*Assistant Examiner* — Tong-Ho Kim
(74) *Attorney, Agent, or Firm* — Murphy, Bilak & Homiller, PLLC (57) ABSTRACT

A power semiconductor device is disclosed. The power semiconductor device includes an upper drift region situated over a lower drift region, a field electrode embedded in the lower drift region, the field electrode not being directly aligned with a gate trench in a body region of the power semiconductor device, where respective top surfaces of the field electrode and the lower drift region are substantially co-planar. A conductive filler in the field electrode can be substantially uniformly doped, and the field electrode is in direct electrical contact with the upper drift region.

16 Claims, 7 Drawing Sheets

POWER SEMICONDUCTOR DEVICE WITH EMBEDDED FIELD ELECTRODES

The present application claims the benefit of and priority to U.S. Provisional Patent Application Ser. No. 61/970,729, filed on Mar. 26, 2014, and entitled "Power Semiconductor Device." The disclosure in this provisional application is hereby incorporated fully by reference into the present application.

BACKGROUND

Trench power semiconductor devices, such as trench power MOSFETs (metal oxide semiconductor field effect transistors), include a p-n junction between a drift region and a body region. On-state resistance (i.e., $R_{DSon}$) and breakdown voltage are two important parameters in a trench power MOSFET. The on-state resistance of a trench power MOSFET is the drain-to-source resistance of the trench power MOSFET in an on-state, which depends partially on the doping level of the drift region. The breakdown voltage of a trench power MOSFET is the voltage at which a reverse biased body-drift p-n junction breaks down and significant current starts to flow between a source and a drain of the trench power MOSFET by an avalanche multiplication process. It is desirable for a trench power semiconductor device to have a reduced $R_{DSon}$ in its on-state, and be able to withstand a high drain-to-source voltage during its off-state (i.e., a high reverse voltage blocking capability). However, there is a trade-off in the design of a trench power semiconductor device, between its reverse voltage blocking capability and its on-state resistance.

One technique for improving the reverse voltage blocking capability of a trench power MOSFET involves placing field plates in the drift region, where the field plates are electrically connected to a fixed electrical potential, such as a gate or source potential in the trench power MOSFET, to allow a depletion region expand in the drift region. However, this may result in a high voltage difference between the field plate and those regions of the drift region close to the drain region in the trench power MOSFET, so that a thick field plate dielectric would be required. For example, since the gate and source are typically at the same potential (e.g., 0 volts) during reverse bias, a relatively thick dielectric is required in the trench to withstand the full drain bias. A thick dielectric, however, adversely increases the on-state resistance of the trench power MOSFET. Another technique involves forming one or more field plates in the same trench as a gate electrode, where the trench extends from the body region into the drift region of the trench power MOSFET. This technique, however, not only requires the field plates be directly aligned with the gate electrode in the trench, but is also difficult to implement and expensive.

One technique for reducing the on-state resistance of a trench power semiconductor device involves reducing the device cell pitch and the pitch of the field plates. However, this cannot be achieved without the expense of reducing the field plate dielectric thickness, which would adversely affect the reverse voltage blocking capability of the trench power semiconductor device.

Accordingly, there is a need to overcome the drawbacks and deficiencies in the art by providing a power semiconductor device, such as a power MOSFET, with a reduced on-state resistance without compromising the reverse voltage blocking capability of the power semiconductor device.

SUMMARY

The present disclosure is directed to a power semiconductor device with embedded field electrodes substantially as shown in and/or described in connection with at least one of the figures, and as set forth in the claims.

DESCRIPTION OF EXEMPLARY IMPLEMENTATIONS

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
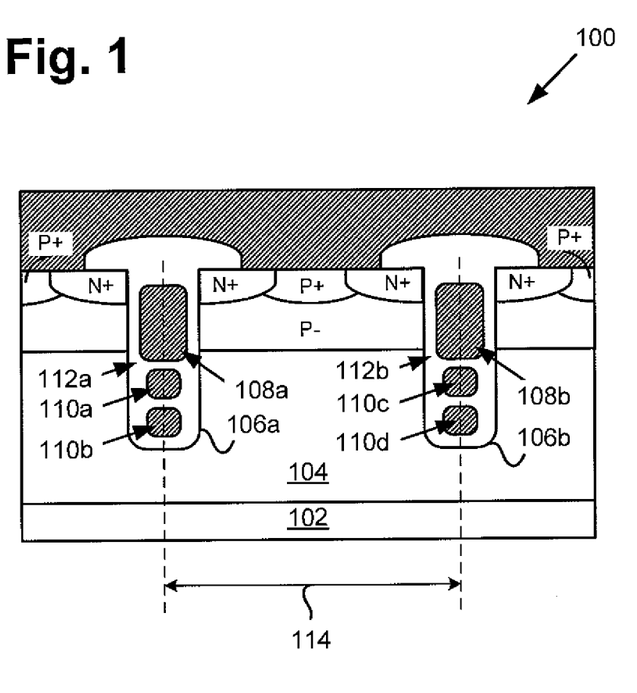
FIG. 1 illustrates a cross-sectional view of a conventional field plate trench power MOSFET.

FIG. 1 illustrates a cross-sectional view of a conventional field plate trench power MOSFET, as described in U.S. Pat. No. 7,638,841 issued on Dec. 29, 2009, and titled "Power Semiconductor Devices and Methods of Manufacture." Structure 100 includes substrate 102, drift region 104, trenches 106a and 106b, gate electrodes 108a and 108b, and field plates 110a, 110b, 110c and 110d, and dielectric materials 112a and 112b. For example, field plates 110a and 110b are biased and aligned directly under gate electrode 108a in the same trench, trench 106a, which is filled with dielectric material 112a. The charge balancing effect of biased field plates 110a through 110d may allow for increasing the doping concentration of drift region 104 while providing reverse voltage blocking capability. However, this requires each of field plates 110a, 110b, 110c and 110d be connected to an external voltage source, which is difficult and costly to implement. Moreover, this technique requires the field plates be directly aligned under the gate electrode within the gate trench. As a result, as illustrated in FIG. 1, pitch 114 between gate electrodes 108a and 108b is the same as the pitch between field plates 110a and 110c and between field plates 110b and 110d. Consequently, the pitch of the field plates cannot be arranged independent of the pitch of the semiconductor devices above.

In another conventional trench power MOSFET, as described in U.S. Patent Application Publication No. US 2002/0102786, published on Aug. 1, 2002, and entitled "Trench MOSFET Formed Using Selective Epitaxial Growth," a selective epitaxy process is used to form a thick bottom oxide under a gate trench of a MOSFET for relaxing the electric field at the bottom of the gate trench. However, this approach does not include a field plate, and undesirably increases the on-resistance of the MOSFET.

Figure 2:
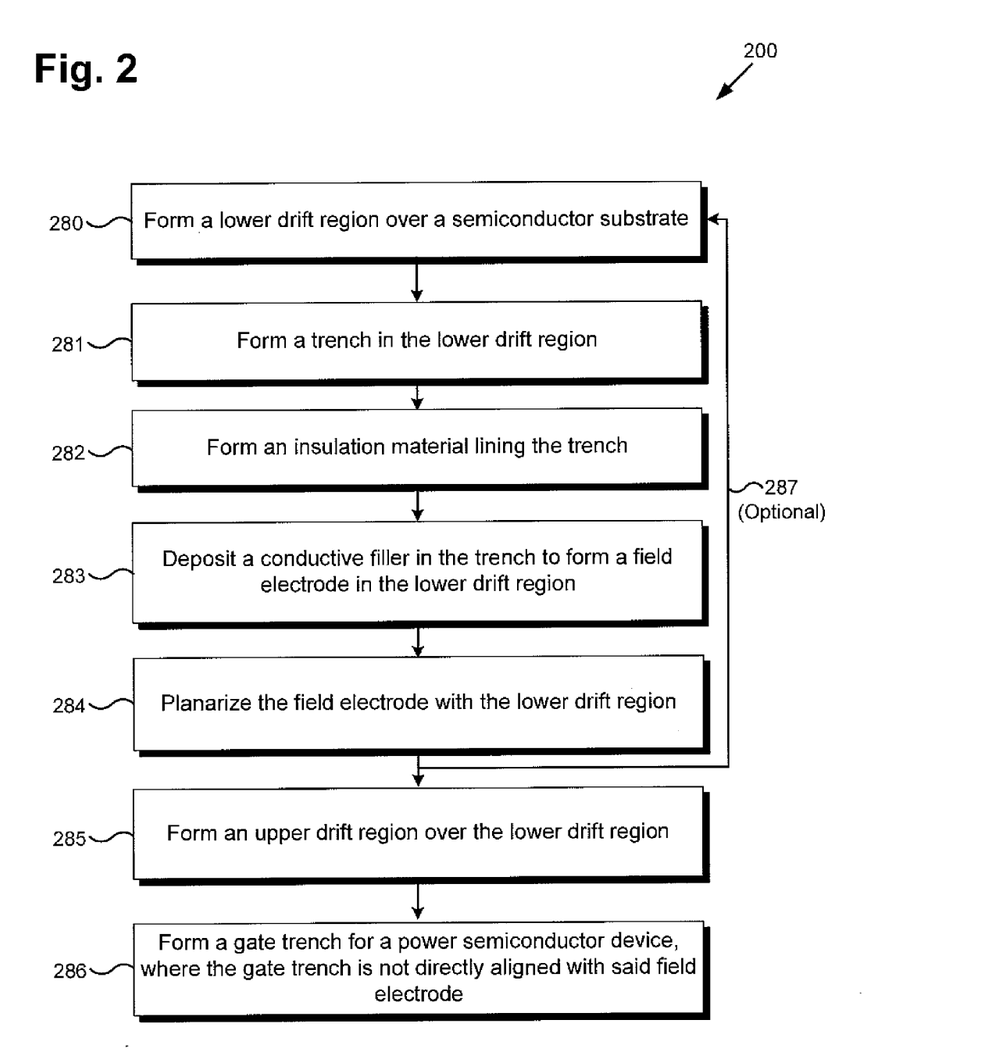
FIG. 2 is a flowchart illustrating a method for fabricating a power semiconductor device according to one implementation of the present application.

Referring to FIG. 2, there is shown flowchart 200, which shows the actions, according to one implementation disclosed herein, for fabricating an advantageous field electrode trench power semiconductor. Certain details and features have been left out of flowchart 200 that are apparent to a person of ordinary skill in the art. For example, an action may comprise one or more sub actions or may involve specialized equipment or materials, as is known in the art. While actions 280 through 287 indicated in flowchart 200 are sufficient to describe one implementation disclosed herein, other implementations disclosed herein may use actions different from those shown in flowchart 200.

As illustrated in flowchart 200, action 280 includes forming a lower drift region over a semiconductor substrate. Action 281 includes forming a trench in the lower drift region. Action 282 includes forming an insulation material lining the trench. Action 283 includes depositing a conductive filler in the trench to form a field electrode in the lower drift region. Action 284 includes planarizing the field electrode with the lower drift region. Action 285 includes forming an upper drift region over the lower drift region. Action 286 includes forming a gate trench for a power semiconductor device, where the gate trench is not directly aligned with said field electrode. Action 287 is an optional action that includes repeating actions 280 through 284 before performing action 285.

Figure 3A:
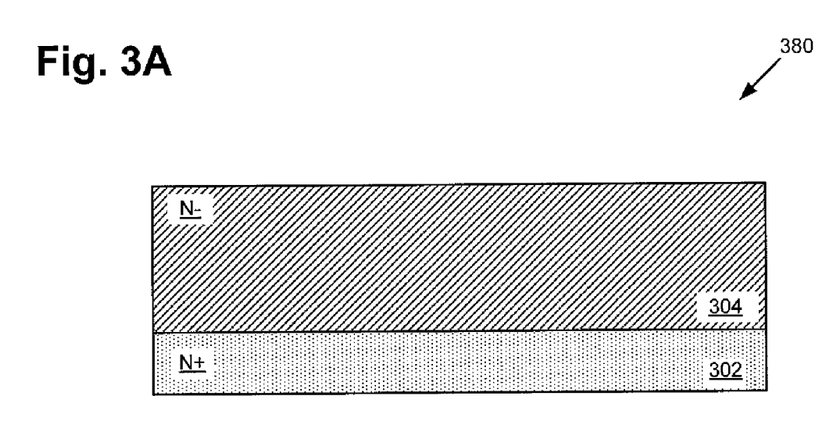
FIG. 3A illustrates a cross-sectional view of a portion of a power semiconductor structure processed in accordance with an initial action in the flowchart of FIG. 2 according to one implementation of the present application.
Figure 3B:
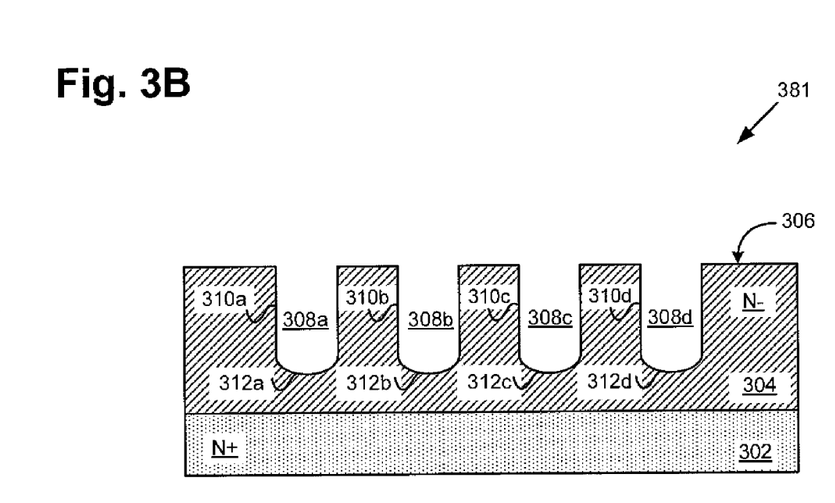
FIG. 3B illustrates a cross-sectional view of a portion of a power semiconductor structure processed in accordance with an intermediate action in the flowchart of FIG. 2 according to one implementation of the present application.
Figure 3C:
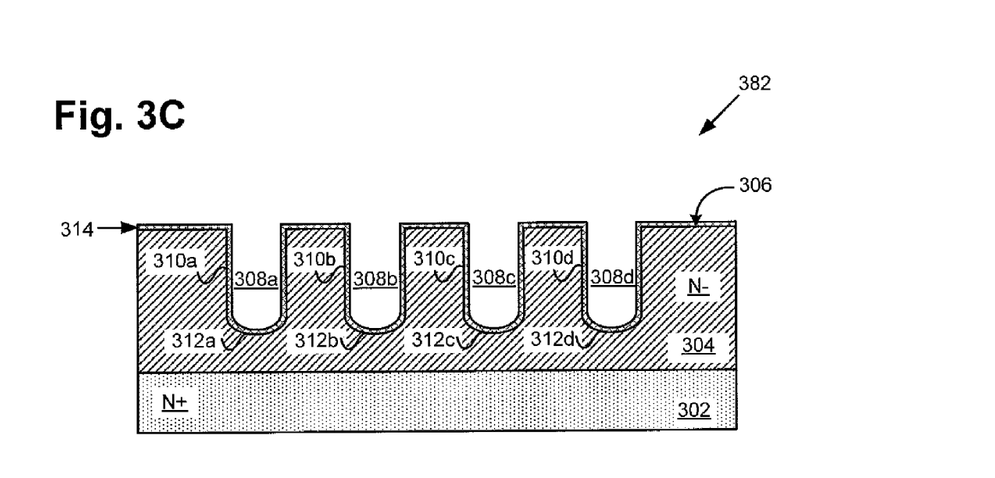
FIG. 3C illustrates a cross-sectional view of a portion of a power semiconductor structure processed in accordance with an intermediate action in the flowchart of FIG. 2 according to one implementation of the present application.
Figure 3D:
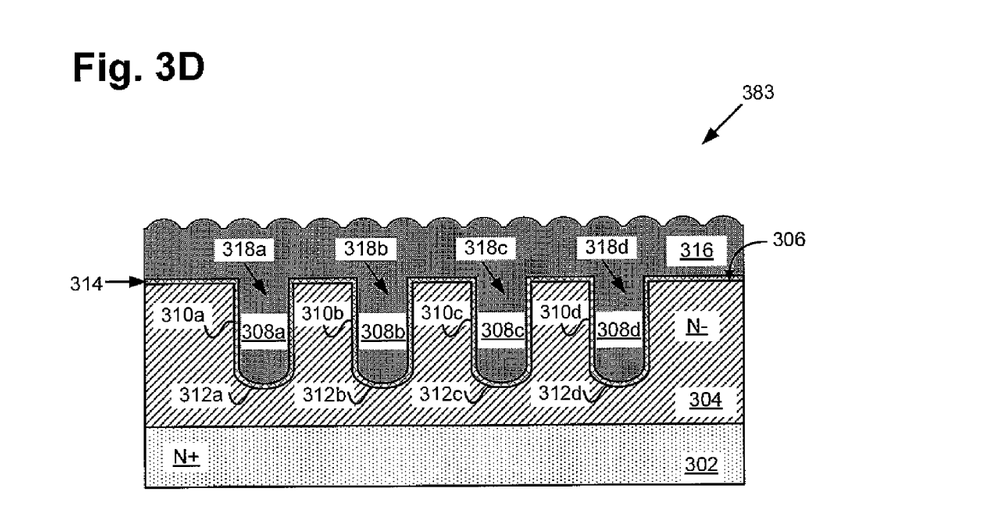
FIG. 3D illustrates a cross-sectional view of a portion of a power semiconductor structure processed in accordance with an intermediate action in the flowchart of FIG. 2 according to one implementation of the present application.
Figure 3E:
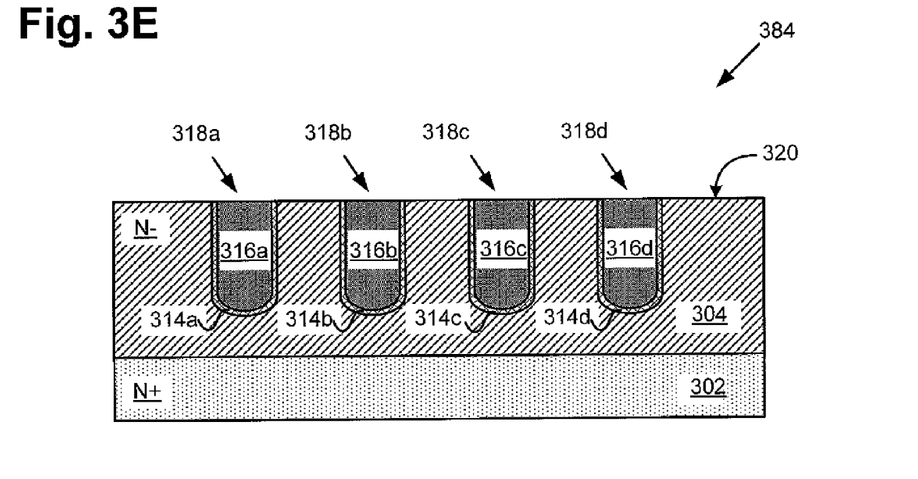
FIG. 3E illustrates a cross-sectional view of a portion of a power semiconductor structure processed in accordance with an intermediate action in the flowchart of FIG. 2 according to one implementation of the present application.
Figure 3F:
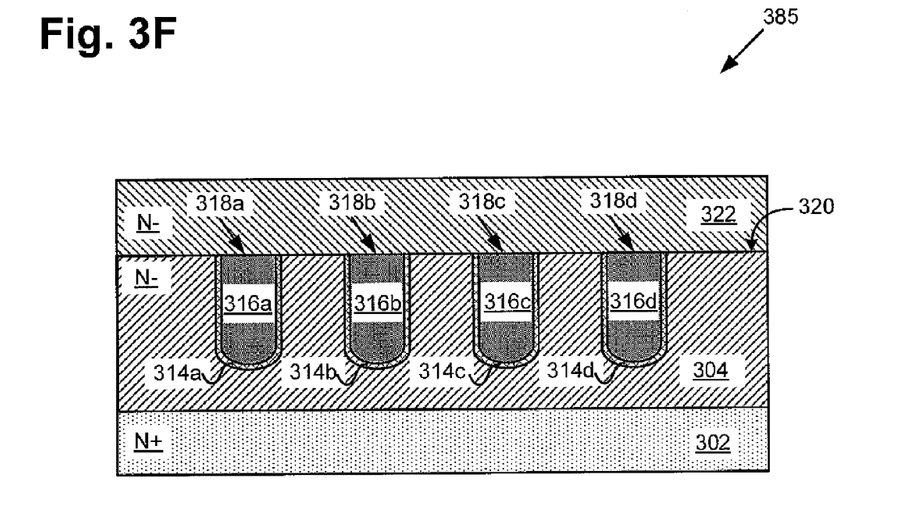
FIG. 3F illustrates a cross-sectional view of a portion of a power semiconductor structure processed in accordance with an intermediate action in the flowchart of FIG. 2 according to one implementation of the present application.
Figure 3G:
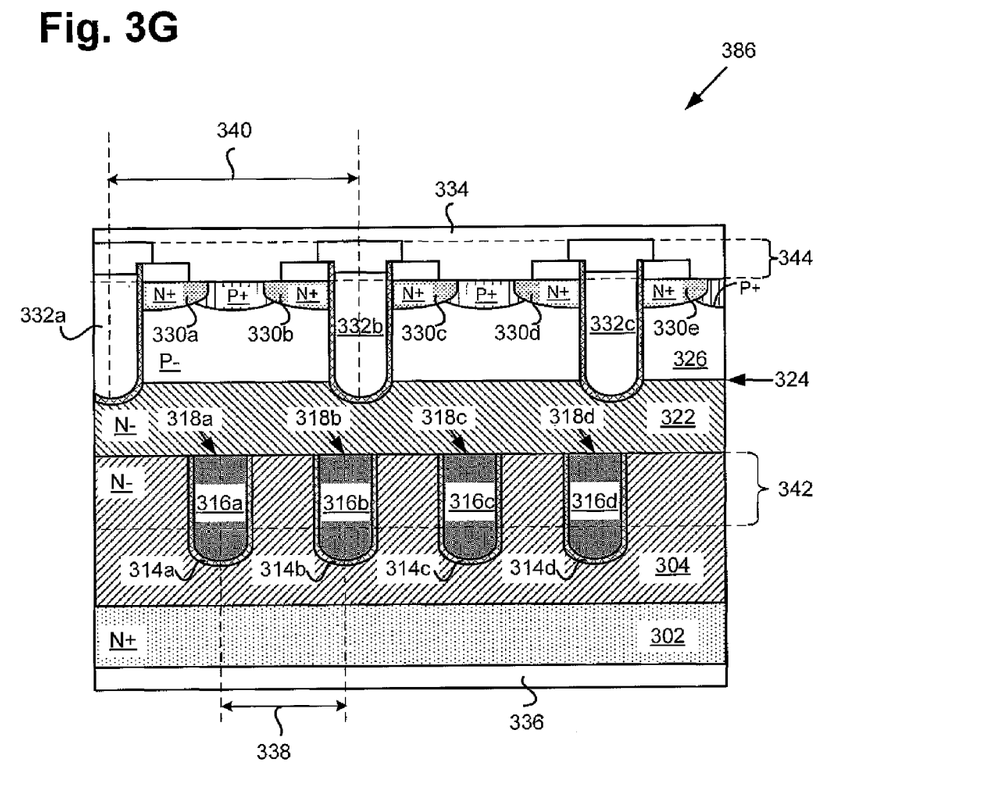
FIG. 3G illustrates a cross-sectional view of a portion of a power semiconductor structure processed in accordance with a final action in the flowchart of FIG. 2 according to one implementation of the present application.

FIGS. 3A through 3G and structures 380 through 386 illustrate the result of performing actions 280 through 286 of flowchart 200 of FIG. 2, respectively. For example, structure 380 shows a power semiconductor structure after action 280, structure 381 shows structure 380 after action 281, structure 382 shows structure 381 after action 282, and so forth. FIG. 3G illustrates a cross-sectional view of a portion of a power semiconductor structure processed in accordance with final action 286 in flowchart 200 of FIG. 2 according to one implementation of the present application.

Referring to FIG. 3A, structure 380 illustrates a cross-sectional view of a portion of a power semiconductor device after completion of action 280 in flowchart 200 of FIG. 2, according to one implementation of the present disclosure. As shown in FIG. 3A, structure 380 includes semiconductor substrate 302 and lower drift region 304 formed over semiconductor substrate 302. In the present implementation, semiconductor substrate 302 is a highly doped silicon substrate, which can form a drain region for a power MOSFET. Semiconductor substrate 302 is of a first conductivity type and is shown as having N+ conductivity by way of example. For example, semiconductor substrate 302 can have a doping concentration around $5 \times 10^{19}$ cm$^{-3}$. In one implementation, semiconductor substrate 302 can include N type dopant, such as Phosphorus or Arsenic. In another implementation, semiconductor substrate 302 can include P type dopant, such as Boron.

Lower drift region 304 can include any semiconductor material that can be epitaxially grown on semiconductor substrate 302. For example, lower drift region 304 includes epitaxial silicon grown on semiconductor substrate 302. Lower drift region 304 is of the first conductivity type and is shown as having N− conductivity by way of example. For example, lower drift region 304 can have a doping concentration between $6.3 \times 10^{16}$ cm$^{-3}$ to $2.5 \times 10^{17}$ cm$^{-3}$. In one implementation, lower drift region 304 can be intrinsically or pre-doped to be an N type material, or that can be subsequently doped to become an N type material, for example. In one implementation, lower drift region 304 can have a thickness between 5-10 microns for a higher voltage device. In another implementation, lower drift region 304 can have a thickness of less than or equal to 0.5 microns for a lower voltage device. In other implementations, lower drift region 304 can have a thickness between 0.5-5 microns, or greater than 10 microns depending on specific requirements of different voltage devices.

Referring to FIG. 3B, structure 381 illustrates a cross-sectional view of a portion of a power semiconductor device after completion of action 281 in flowchart 200 of FIG. 2, according to one implementation of the present disclosure. As shown in FIG. 3B, structure 381 includes trenches 308a, 308b, 308c and 308d (collectively referred to as "trenches 308") formed in lower drift region 304. For example, trenches 308 can be formed by etching lower drift region 304 using a patterned photoresist layer (not shown in FIG. 3B). Thus, trenches 308 extend from top surface 306 into lower drift region 304. As illustrated in FIG. 3B, trenches 308a, 308b, 308c and 308d respectfully include opposing sidewalls 310a, 310b, 310c and 310d, which are substantially parallel to one another and extend into respective trench bottoms 312a, 312b, 312c and 312d. In the present implementation, trenches 308 each include a U-shaped bottom. In another implementation, trenches 308 may each include a flat bottom.

Referring to FIG. 3C, structure 382 illustrates a cross-sectional view of a portion of a power semiconductor device after completion of action 282 in flowchart 200 of FIG. 2, according to one implementation of the present disclosure. As shown in FIG. 3C, structure 382 includes insulation material 314 lining top surface 306 of lower drift region 304, opposing sidewalls 310a, 310b, 310c and 310d, and trench bottoms 312a, 312b, 312c and 312d of trenches 308a, 308b, 308c and 308d, respectively. For example, forming insulation material 314 can include depositing and/or thermally growing an insulation material on top surface 306 and in trenches 308. In the present implementation, insulation material 314 includes silicon dioxide. In another implementation, insulation material 314 can include silicon nitride, or other suitable dielectric material.

Referring to FIG. 3D, structure 383 illustrates a cross-sectional view of a portion of a power semiconductor device after completion of action 283 in flowchart 200 of FIG. 2, according to one implementation of the present disclosure. As shown in FIG. 3D, structure 383 includes conductive filler 316 deposited over structure 382 in FIG. 3C. In particular, conductive filler 316 is deposited in trenches 308 and over top surface 306 of lower drift region 304, where insulation material 314 is disposed between conductive filler 316 and lower drift region 304. As such, field electrodes 318a, 318b, 318c and 318d (collectively referred to as "field electrodes 318") are formed in trenches 308a, 308b, 308c and 308d, respectively.

In the present implementation, conductive filler 316 can include polysilicon or amorphous silicon. For example, N type doped polysilicon or N type doped amorphous silicon can be used as conductive filler 316 to fill in trenches 308. In some implementations, it may be preferred to use polysilicon or amorphous silicon as conductive filler 316, because of their compatibility with an epitaxial growth of an upper drift region in a subsequent processing action. Furthermore, in the case where polysilicon or amorphous silicon is used as conductive filler 316, the doping concentration of conductive filler can be well controlled such that conductive filler 316 can have a substantially uniform doping concentration in each of trenches 308. In other implementations, metallic material, such as Tungsten and Tungsten Silicide, can be used as conductive filler 316.

Referring to FIG. 3E, structure 384 illustrates a cross-sectional view of a portion of a power semiconductor device having portions of a conductive filler, an insulation material and a lower drift region removed, such that the conductive filler, the insulation material and the lower drift region have a substantially co-planar top surface, after completion of action 284 in flowchart 200 of FIG. 2, according to one implementation of the present disclosure. Specifically, structure 384 includes field electrodes 318a, 318b, 318c and 318d, and lower drift region 304 having substantially co-planar top surface 320.

As illustrated in FIG. 3E, excess portions of conductive filler 316, insulation material 314 on top surface 306 as appeared in structure 383 of FIG. 3D are removed by, for example, a chemical-mechanical polishing (CMP) process. The CMP process may also remove portions of lower drift region 304 from top surface 306. As a result, conductive filler 316a and insulation material 314a of field electrode 318a, conductive filler 316b and insulation material 314b of field electrode 318b, conductive filler 316c and insulation material 314c of field electrode 318c, conductive filler 316d and insulation material 314d of field electrode 318d, and lower drift region 304 have substantially co-planar top surface 320 after completion of action 284 in flowchart 200 of FIG. 2. In other implementations, an etch-back and/or other suitable planarization techniques can be utilized to form substantially co-planar top surface 320 in structure 384.

Referring to FIG. 3F, structure 385 illustrates a cross-sectional view of a portion of a power semiconductor device having an upper drift region formed over a substantially co-planar top surface, after completion of action 285 in flowchart 200 of FIG. 2, according to one implementation of the present disclosure. As shown in FIG. 3F, structure 385 includes upper drift region 322 formed over substantially co-planar top surface 320 of structure 384 in FIG. 3E. Upper drift region 322 can be formed over lower drift region 304 by epitaxial growth, deposition, or direct wafer bonding. In the present implementation, upper drift region 322 can include any N type semiconductor material that can be epitaxially grown over lower drift region 304. Upper drift region 322 can be intrinsically or pre-doped to be an N type material, or that can be subsequently doped to become an N type material, for example. Thus, field electrodes 318a through 318d are in direct mechanical and electrical contact with upper drift region 322 through substantially co-planar top surface 320, thereby ensuring good switching speed and eliminating the need for another mask or structure for connection.

Referring to FIG. 3G, structure 386 illustrates a cross-sectional view of a portion of a power semiconductor device having at least one power MOSFET over an upper drift region, where a gate trench of the power MOSFET is not directly aligned with a field electrode in a lower drift region, after completion of action 286 in flowchart 200 of FIG. 2, according to one implementation of the present disclosure. As shown in FIG. 3G, structure 386 includes semiconductor substrate 302 of a first conductivity type, lower drift region 304 of the first conductivity type and having field electrodes 318a, 318b, 318c and 318d, upper drift region 322 of the first conductivity, body region 326 of a second conductivity formed over upper drift region 322, p-n junction 324, gate trenches 332a, 332b and 332c each extending through body region 326 into upper drift region 322, conductive regions 330a, 330b, 330c, 330d and 330e of the first conductivity over body region 326 and adjacent to respective gate trenches 332a, 332b and 332c.

Structure 385 further includes first power electrode 334 electrically connected to conductive regions 330a, 330b, 330c, 330d and 330e, and second power electrode 336 electrically connected to semiconductor substrate 302. A power semiconductor device according to the one implementation may be a power MOSFET, in which case, conductive regions 330a through 330e are source regions, first power electrode 334 is a source electrode, semiconductor substrate 302 is a drain region, and second power electrode 336 is a drain electrode. In another implementation, a device may be an IGBT, in which case, conductive regions 330a through 330e may be emitter regions, first power electrode 334 may be an emitter electrode, semiconductor substrate 302 is a collector region, and second power electrode 336 may be a collector electrode.

By way of example, in the present implementation, semiconductor substrate 302 of the first conductivity type and is shown as having N+ conductivity by way of example. Semiconductor substrate 302 can have a high doping concentration around $5\times10^{19}$ cm$^{-3}$. Lower drift region 304 of the first conductivity type is shown as having N− conductivity, and has a doping concentration around $1.3\times10^{17}$ cm$^{-3}$ (e.g., 0.07 ohm-cm). Upper drift region 322 of the first conductivity type is shown as having N− conductivity, and has a doping concentration around $6.3\times10^{16}$ cm$^{-3}$. In one implementation, lower drift region 304 and upper drift region 322 may have the same doping concentration. Conductive fillers 316a through 316d of the first conductivity type each have a substantially uniform doping concentration about $1.0\times10^{18}$ cm$^{-3}$. In one implementation, conductive fillers 316a through 316d of the first conductivity type may each have a substantially uniform doping concentration of greater than $1.0\times10^{18}$ cm$^{-3}$. In other implementations, semiconductor substrate 302, lower drift region 304, upper drift region 322 and conductive fillers 316a through 316d can have other suitable doping concentrations.

In the present implementation, lower drift region 304 may have a thickness of 0.5-10 microns. Upper drift region 322 may have a thickness of about 0.8 microns. Insulation materials 314a through 314d in respective field electrodes 318a through 318d may each have a thickness of 450 Angstroms. Pitch 338, which is the lateral distance between two adjacent field electrodes, may be about 0.7 microns. By comparison, pitch 340, which is the lateral distance between two adjacent gate trenches, may be about 1.4 microns, which is two times of pitch 338 of the field electrodes. In anther implementation, field electrodes 318a through 318d can be arranged even closer to one another such that a ratio of pitch 340 to pitch 338 can be greater than 2:1. In other implementations, pitch 338 of the field electrodes can be between 0.1 to 10 microns. Thus, as an advantageous aspect of the present disclosure, pitch 338 of the field electrodes is independent of pitch 340 of the gate trenches above. In other implementations, lower drift region 304, upper drift region 322, and insulation materials 314a through 314d can have other suitable thicknesses.

As can be seen in FIG. 3G, field electrodes 318a through 318d are not directly aligned with any of gate trenches 332a through 332c above. For example, field electrode 318c is situated below conductive region 330c, which may be a source of a power MOSFET. In the present implementation, field electrodes 318a through 318d are formed in parallel strips that run along the direction of gate trenches 332a, 332b and 332c above them. In another implementation, field electrodes 318a through 318d are formed in parallel strips that run perpendicular to the direction of gate trenches 332a, 332b and 332c above them (not shown in FIG. 3G). In yet another implementations, the field electrodes can be arranged in two-dimensional or three-dimensional arrays below the semiconductor devices. For example, the field electrodes can be arranged in three-definitional concentric cylindrical arrays in lower drift region 304 under the gate trenches. In other implementations, at least some of the field electrodes can be aligned with the gate trenches.

As illustrated in FIG. 3G, field electrodes 318a through 318d do not have dielectric on their respective top surfaces since a planarizing action was performed, for example, as described in action 284 in flowchart 200. Thus, field electrodes 318a through 318d are in direct electrical contact with upper drift region 322, thereby shorted to upper drift region 322. When structure 386 is reverse biased, for example, an electric potential of about $3.8 \times 10^1$ volts is applied at second power electrode 336, the electric potential gradually decreases to between $2.2 \times 10^1$ and $1.5 \times 10^1$ volts in region 342 in lower drift region 304, for example. The electrical potential further decreases to the lowest potential of about $-5.3 \times 10^{-1}$ volts in region 344. Thus, field electrodes can be held at approximately an intermediate potential between the source and the drain of the power semiconductor device during reverse bias.

Thus, at a given reverse bias voltage potential, such as 38 volts, the potential difference across each of insulation materials 314a through 314d (i.e., between conductive fillers 316a through 316d and respective portions of lower drift region 304 below field electrodes 318a through 318d) can be as little as 16 volts, such that insulation materials 314a through 314d can be 450 Angstroms or thinner while being able to withstand a reverse bias voltage of 38 volts. Thus, the reduced thickness of insulation materials 314a through 314d help substantially reduce the $R_{DSon}$ of structure 386 substantially without compromising the reverse voltage blocking capability of the power semiconductor device.

Figure 4:
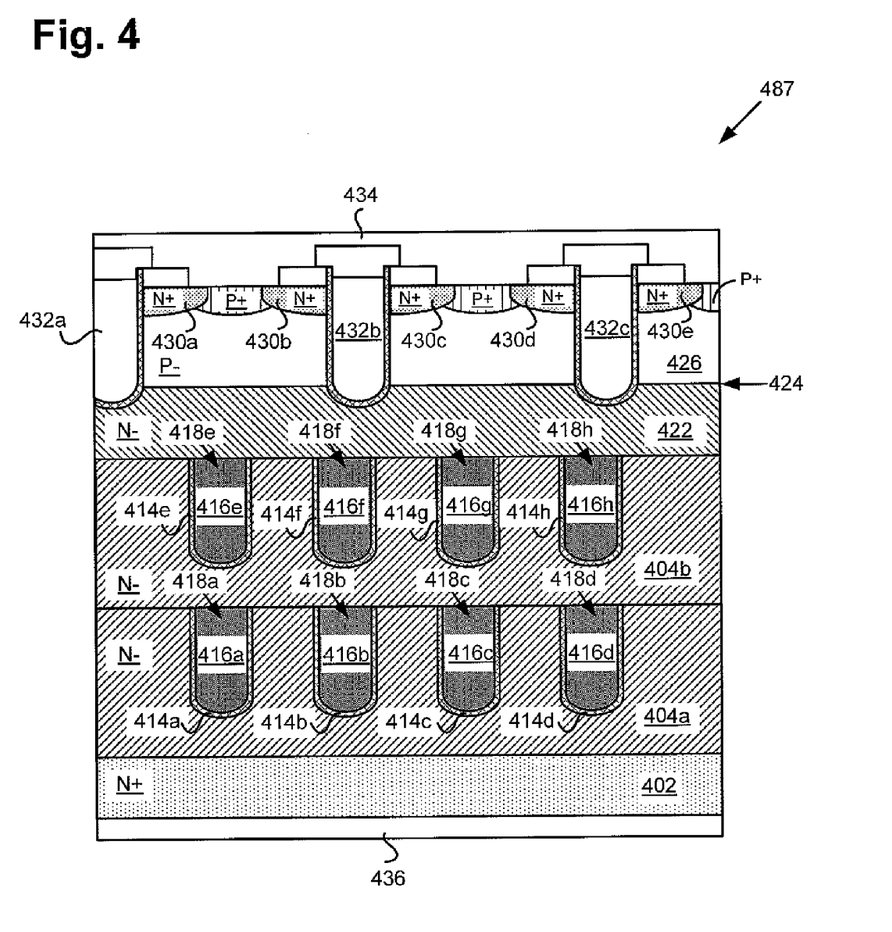
FIG. 4 illustrates a cross-sectional view of a portion of a power semiconductor structure according to an alternative implementation of the present application.

Referring to FIG. 4, FIG. 4 illustrates a cross-sectional view of a portion of a power semiconductor structure according to an alternative implementation of the present application. In FIG. 4, similar numerals may refer to similar features in structure 386 of FIG. 3. Structure 487 includes semiconductor substrate 402 of a first conductivity type, first lower drift region 404a of the first conductivity type and having field electrodes 418a, 418b, 418c and 418d, second lower drift region 404b of the first conductivity type and having field electrodes 418e, 418f, 418g and 418h, upper drift region 422 of the first conductivity, body region 426 of a second conductivity formed over upper drift region 422, p-n junction 424, gate trenches 432a, 432b and 432c each extending through body region 426 into upper drift region 422, conductive regions 430a, 430b, 430c, 430d and 430e of the first conductivity over body region 426 and adjacent to respective gate trenches 432a, 432b and 432c. For example, second lower drift region 404b may be formed as a result of performing action 287 (i.e., repeating actions 280 through 284) after the formation of structure 384 in FIG. 3E.

Structure 487 further includes first power electrode 434 electrically connected to conductive regions 430a through 430e, and second power electrode 436 electrically connected to semiconductor substrate 402. A power semiconductor device according to an implementation may be a power MOSFET, in which case, conductive regions 430a through 430e are source regions, first power electrode 434 is a source electrode, semiconductor substrate 402 is a drain region, and second power electrode 436 is a drain electrode. In another implementation, a device may be an IGBT, in which case, conductive regions 430a through 430e may be emitter regions, first power electrode 434 may be an emitter electrode, semiconductor substrate 402 may be a collector region, and second power electrode 436 may be a collector electrode. By stacking one or more lower drift regions having embedded field electrodes, implementations of the present disclosure can achieve a given breakdown voltage rating as a substantially reduced on-state resistance.

In some implementations, actions 280 through 284 of flowchart 200 may be repeated multiple times as indicated by optional action 287 if a multi-layered power semiconductor device is desired. For example, in one implementation, action 287 of flowchart 200 may be repeated three times, such that four layers of lower drift regions with embedded field electrodes can be formed before fabricating a trench power MOSFET on the top. In comparison to a conventional trench power MOSFET having a breakdown voltage rating of 100 V, which requires a buried source oxide thickness of 0.5-1.0 microns and a silicon to oxide ratio of 1:1, a power semiconductor device, according to an implementation of the present application, having four layers of lower drift regions with embedded field electrodes can achieve the same 100V breakdown voltage rating while only requiring an oxide thickness of the field electrodes to be 450 Angstroms, thus resulting in a reduction of oxide thickness by at least a factor of 10 or greater. Thinner oxide leads to more areas for silicon for current conduction. For example, the power semiconductor device, having four layers of lower drift regions with embedded field electrodes, can have an R*AA (on resistance per active area figure of merit) of about 17 mΩ-mm$^2$, as compared to the conventional device with about 45 mΩ-mm$^2$. Thus, the implementations of the present disclosure allow a power semiconductor device with a lower $R_{DSon}$ to be fabricated for any given breakdown voltage. Furthermore, for structures requiring multiple layers of field electrodes, each layer can be arranged independently from one another, having different shapes, pitches, orientations, and oxide thicknesses, etc. In some implementations, the field plate could also be connected at some other point in the structure, depending on the particular application and method chosen to manufacture the device.

The above-described exemplary implementations of the present application result in reduced R*AA, hence reduced $R_{DSon}$, for any given breakdown voltage by allowing thinner insulation materials to be used in the drift region. The above-described implementations also result in the field plates directly connected to the upper drift region, thus ensuring good switching and eliminating the need for another mask or structure. Moreover, the above-described implementations allow the pitch of the field plates to be independent of the pitch or other structure of the power devices. As such, for structures requiring multiple lower drift regions with field plates, each lower drift region can be fabricated independently (pitch, orientation, oxide thickness, etc.).

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power semiconductor device comprising:
   an upper drift region situated over a lower drift region;
   a field electrode embedded in said lower drift region;
   said field electrode not being directly aligned with a gate trench in a body region of said power semiconductor device;
   wherein respective top surfaces of said field electrode and said lower drift region are substantially co-planar;
   wherein said gate trench runs lengthwise in a direction parallel to said top surface of said lower drift region;
   wherein said field electrode is situated in a trench in said lower drift region that runs lengthwise along the same direction as said gate trench.

2. The power semiconductor device of claim 1, wherein said field electrode comprises a conductive filler and an insulation material in said trench in said lower drift region.

3. The power semiconductor device of claim 1, wherein said field electrode comprises polysilicon.

4. The power semiconductor device of claim 1, wherein said field electrode comprises amorphous silicon.

5. The power semiconductor device of claim 1, wherein said field electrode is held at approximately an intermediate potential between a source and a drain of said power semiconductor device under reverse bias.

6. The power semiconductor device of claim 1, further comprising another field electrode in said lower drift region, wherein said top surface of said field electrode is substantially co-planar with a top surface of said another field electrode.

7. The power semiconductor device of claim 1, wherein said field electrode is situated below a source of said power semiconductor device.

8. The power semiconductor device of claim 1, wherein said field electrode is in direct electrical contact with said upper drift region.

9. A power semiconductor device comprising:
   an upper drift region situated over a lower drift region;
   a field electrode embedded in said lower drift region;
   said field electrode not being directly aligned with a gate trench in a body region of said power semiconductor device;
   wherein respective top surfaces of said field electrode and said lower drift region are substantially co-planar;
   wherein said gate trench runs lengthwise in a direction parallel to said top surface of said lower drift region;
   wherein a conductive filler in said field electrode is substantially uniformly doped;
   wherein said field electrode is situated in a trench in said lower drift region that runs lengthwise along the same direction as said gate trench.

10. The power semiconductor device of claim 9, wherein said field electrode comprises a conductive filler and an insulation material in said trench in said lower drift region.

11. The power semiconductor device of claim 9, wherein said field electrode comprises polysilicon.

12. The power semiconductor device of claim 9, wherein said field electrode comprises amorphous silicon.

13. The power semiconductor device of claim 9, wherein said field electrode is held at approximately an intermediate potential between a source and a drain of said power semiconductor device under reverse bias.

14. The power semiconductor device of claim 9, further comprising another field electrode in said lower drift region, wherein said top surface of said field electrode is substantially co-planar with a top surface of said another field electrode.

15. The power semiconductor device of claim 9, wherein said field electrode is situated below a source of said power semiconductor device.

16. The power semiconductor device of claim 9, wherein said field electrode is in direct electrical contact with said upper drift region.

* * * * *